US009265168B1

(12) United States Patent
Lin et al.

(10) Patent No.: US 9,265,168 B1
(45) Date of Patent: Feb. 16, 2016

(54) ELECTRONIC DEVICE REPLACEMENT STRUCTURE

(71) Applicants: GRT Tech Co., Ltd., New Taipei (TW); Hsuan-Chih Lin, New Taipei (TW); Chun-Cheng Lee, Taichung (TW)

(72) Inventors: Hsuan-Chih Lin, New Taipei (TW); Chun-Cheng Lee, Taichung (TW)

(73) Assignees: GRT TECH CO., LTD., New Taipei (TW); Hsuan-Chih Lin, New Taipei (TW); Chun-Cheng Lee, Taichung (TW)

( * ) Notice: Subject to any disclaimer, the term of this patent is extended or adjusted under 35 U.S.C. 154(b) by 0 days.

(21) Appl. No.: 14/469,040

(22) Filed: Aug. 26, 2014

(51) Int. Cl.
*H05K 5/00* (2006.01)
*H05K 5/02* (2006.01)
*H05K 5/06* (2006.01)

(52) U.S. Cl.
CPC .............. *H05K 5/026* (2013.01); *H05K 5/0221* (2013.01); *H05K 5/0247* (2013.01); *H05K 5/06* (2013.01)

(58) Field of Classification Search
USPC .................. 361/728–732, 752, 807, 809, 810
See application file for complete search history.

(56) References Cited

U.S. PATENT DOCUMENTS 4,789,343 A 12/1988 Dougherty et al.
6,597,152 B1 * 7/2003 Jacobs et al. .................. 320/113
7,989,969 B2 * 8/2011 Grant et al. ................... 290/1 A
8,558,413 B1 10/2013 Lepard
9,142,992 B2 * 9/2015 Malackowski et al.

FOREIGN PATENT DOCUMENTS

GB 2289381 A 11/1995
WO 2014/079161 A1 5/2014

OTHER PUBLICATIONS

Search Report of the Corresponding European Patent Application No. 14182204.9 issued on Mar. 2, 2015.

* cited by examiner

*Primary Examiner* — Hung S Bui
(74) *Attorney, Agent, or Firm* — Chun-Ming Shih; HDLS IPR Services

(57) ABSTRACT

An electronic device replacement structure (100) includes a housing body (102) and an electronic module (200, 200'). The housing body (102) includes a base (110) and at least one clasping member (120) connected with one side of the base (110). The base (110) is disposed inside the housing body (102), and a first plate (130) is protrudingly disposed on the base (110). The electronic module (200, 200') is disposed on the base (110) and corresponding to the clasping member (120). The electronic module (200, 200') includes a casing (210) and a fastening implement (300) connected to the casing (210). The fastening implement (300) has at least one elastic locking element (310) and a second plate (320). The elastic locking element (310) is engaged with the clasping member (120). The second plate (320) protrudes toward the first plate (130) and contacts against the first plate (130).

13 Claims, 7 Drawing Sheets

ELECTRONIC DEVICE REPLACEMENT STRUCTURE

BACKGROUND

1. Technical Field

The present invention relates to a replacement structure and, in particular, to an electronic device replacement structure in a modular design.

2. Related Art

Conventional road lighting equipments utilize a mercury lamp or a sodium lamp as a light source which illuminates a wider illumination zone but consumes more power, cannot be recycled, and therefore is not environmentally friendly. In recent years, the technology of a light emitting diode (LED) is increasingly developed. The LED has advantages such as high luminance, power-saving, environmental friendliness, a long life span, so has been widely used for lamp lighting and then used for road lighting.

When a street lamp malfunctions, it has to be repaired immediately in order to protect safety of passers-by. In general, a repairman has to use an elevated work platform (such as a cherry picker) in order to replace or repair the street lamp. However, most malfunction conditions of conventional street lamps are scenarios in which a power supply device or a sensor controlling on-and-off of the LED street lamp is damaged or malfunctioning. The repairman has to remove a lampshade or a housing of an LED street lamp, and then disassemble the said lamp to check and repair components one by one. Therefore, such a maintenance method not only wastes time but also increases maintenance costs.

Furthermore, since there are various street lamp structures in which the structures are complicated and do not have a unified standard. If the original manufacturers do not produce some component, it will cause problems and inconveniences in the repairing and maintenance of the street lamps.

In view of the foregoing, the inventor made various studies to improve the above-mentioned problems to realize the improvements by inventing an electronic device replacement structure.

BRIEF SUMMARY

It is an object of the present invention to provide an electronic device replacement structure, in which assembling, disassembling and replacing can be achieved without any tools, and meanwhile, the entrance of moisture is also prevented, so that a life span of the electronic device is prolonged.

Accordingly, the present invention provides an electronic device replacement structure comprising a housing body and an electronic module. The housing body includes a base and at least one clasping member connected to one side of the base. The base is disposed inside the housing body, and a first plate is protrudingly disposed on the base. The electronic module is disposed on the base and corresponding to the clasping member. The electronic module includes a casing and a fastening implement connected to the casing. The fastening implement has at least one elastic locking element and a second plate. The elastic locking element is engaged with the clasping member. The second plate protrudes toward the first plate and contacts against the first plate.

The present invention has the following effects: the elastic locking element and the second plate are integrally formed with the fastening implement, so the structure is simplified, and assembling and replacing can be easily achieved without assistance of any other tool; the standardized fastening implement is suitable for use on products of any electronic module. Therefore, it is unnecessary to worry about problems such as the products may be pulled off production line, or manufacturing is not easy. Furthermore, the electronic module of the present invention has a wide application field including the street lamp structure but not limited thereto. The application field of the electronic module includes a power supply device, a wireless inductive module, and other electronic products requiring fast assembling and disassembling.

The present invention has the following effects: the elastic locking element and the second plate are integrally formed with the fastening implement, so the structure is simplified, and assembling and replacing can be easily achieved without assistance of any other tool; the standardized fastening implement is suitable for use on products of any electronic module. Therefore, it is unnecessary to worry about problems such as the products may be pulled off production line, or manufacturing is not easy. Furthermore, the electronic module of the present invention has a wide application field including the street lamp structure but not limited thereto. The application field of the electronic module includes a power supply device, a wireless inductive module, and other electronic products requiring fast assembling and disassembling.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
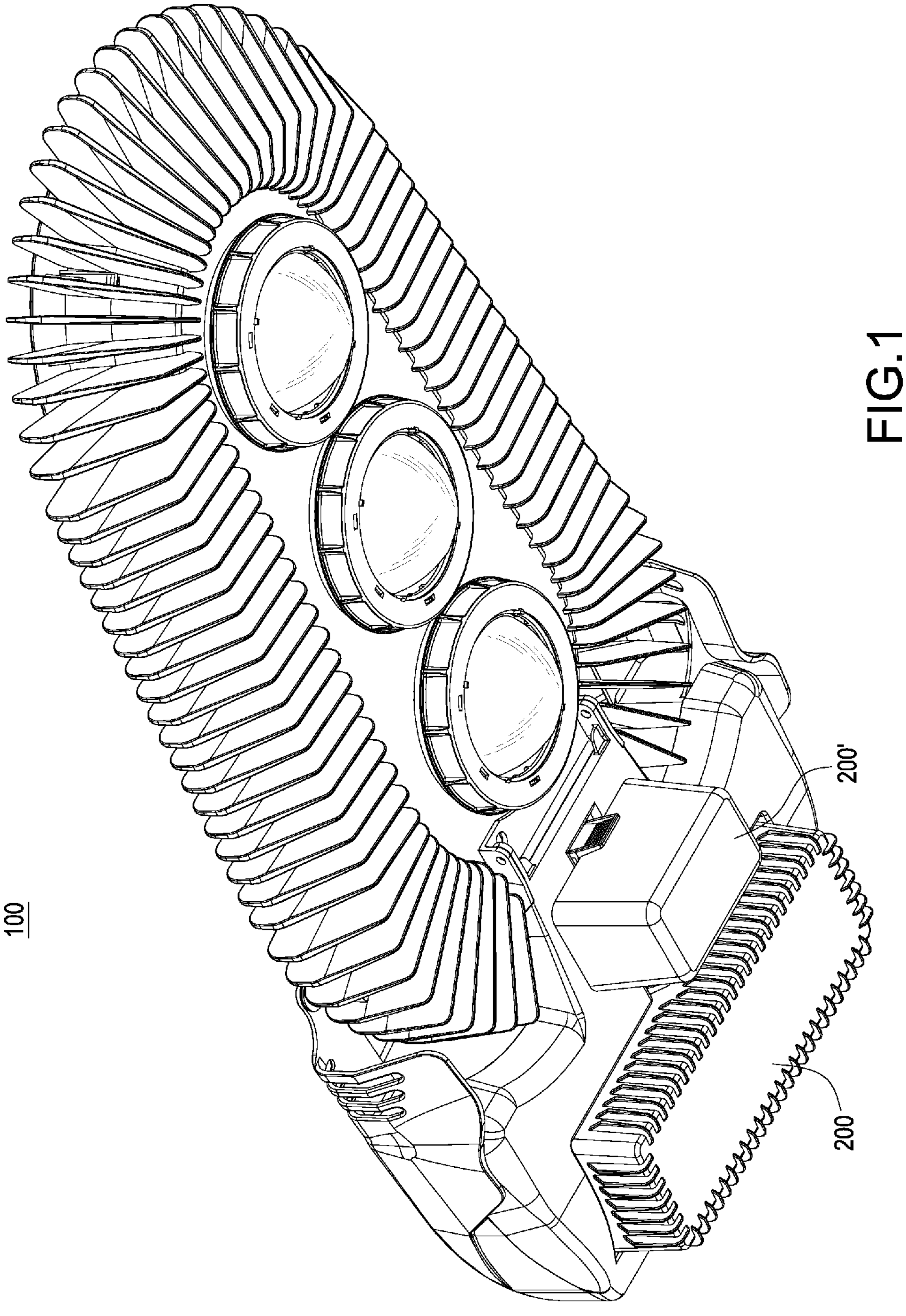
FIG. 1 is a perspective view of an electronic device replacement structure according to one embodiment of the present invention.
Figure 2:
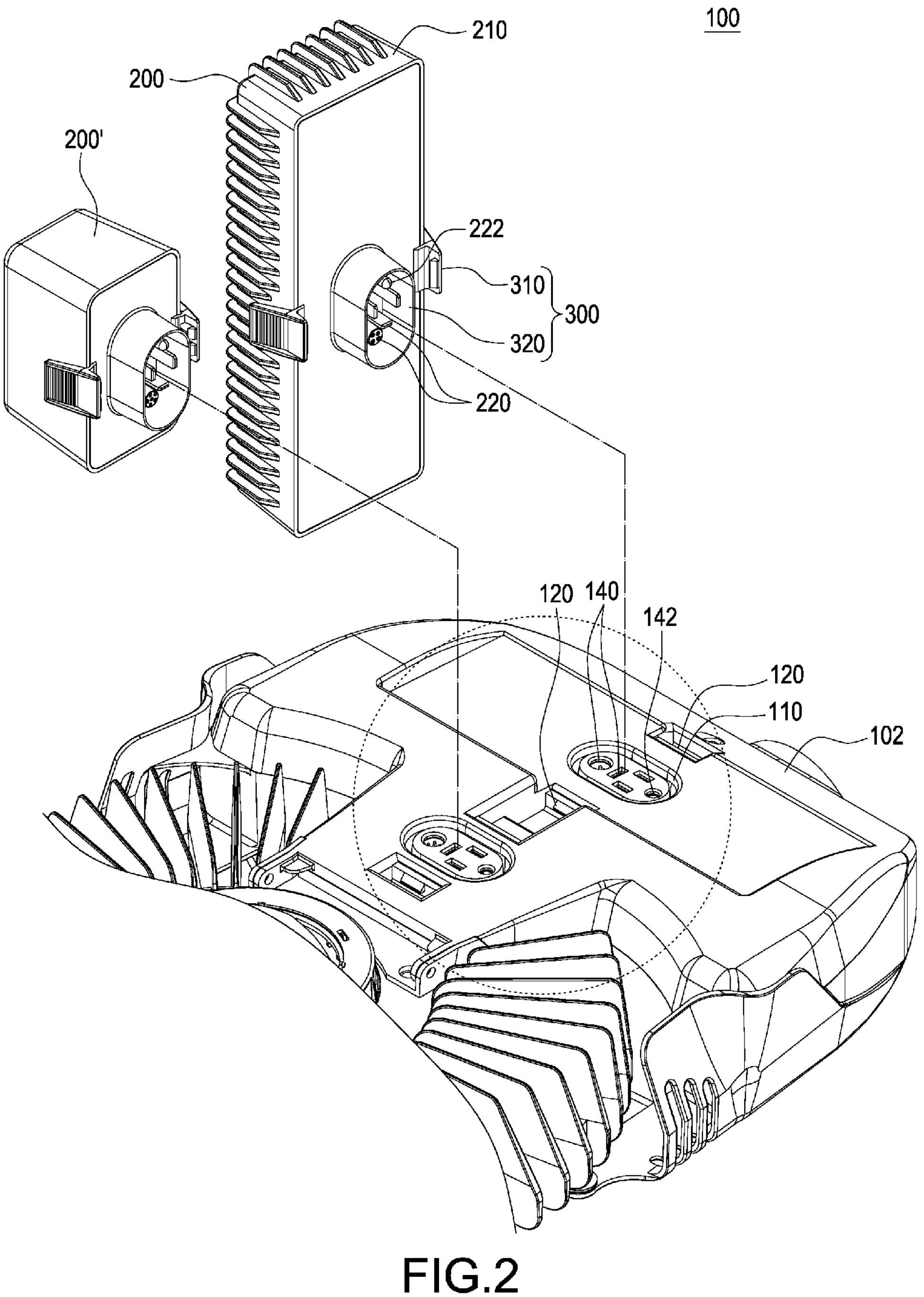
FIG. 2 is a partially exploded view of FIG. 1.

As shown in FIGS. 1 and 2, the present invention provides an electronic device replacement structure 100 which includes a housing body 102 and an electronic module 200, 200'. According to the present embodiment, preferably, the electronic modules 200, 200' are respectively a power supply device providing a power source and/or a wireless smart inductive appliance (not illustrated) which controls on-and-off, brightness, or an illumination time of an LED light source (not illustrated). The wireless smart inductive appliance herein needs to be used with a monitor host (not illustrated). A user operates the monitor host to transmit a wireless signal to the wireless inductive appliance to control the LED light source. However, in different embodiments, the electronic modules 200, 200' can be used in any mobile device, machine, or instrument that requires fast assembling, disassembling or repairing.

Figure 3:
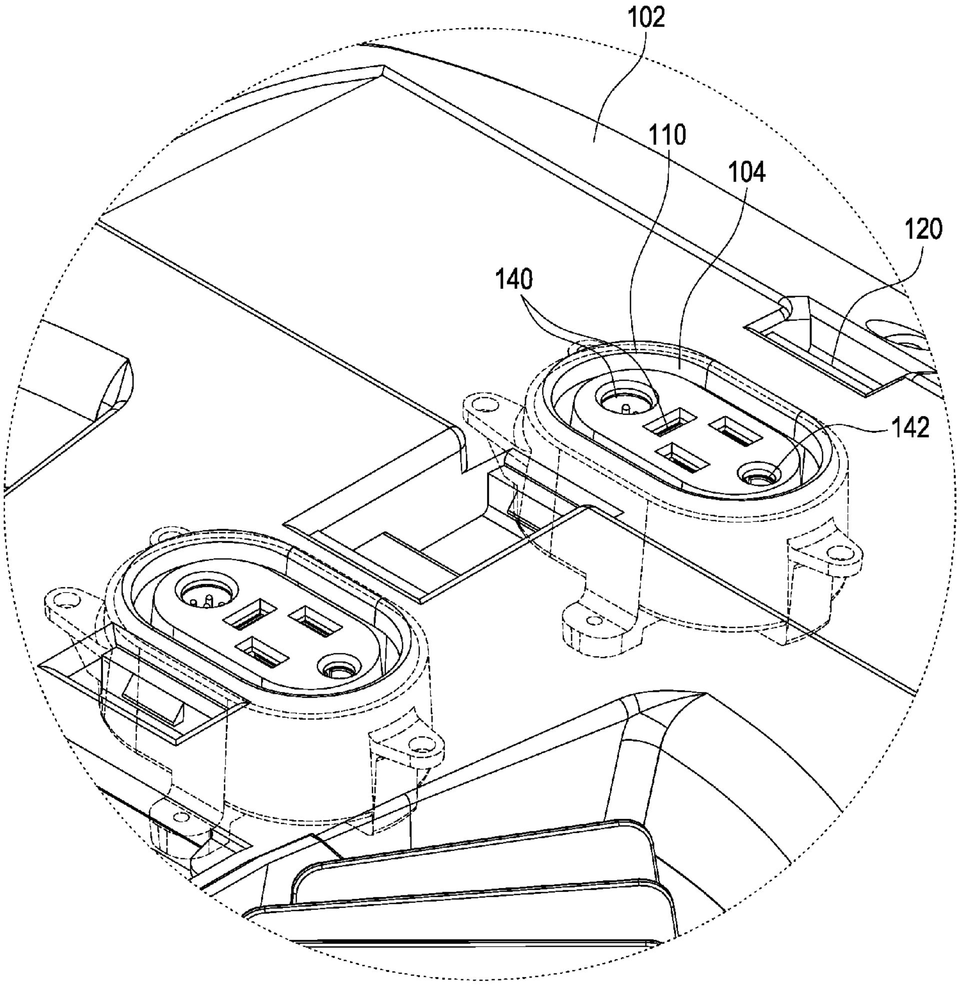
FIG. 3 is a partially enlarged view of FIG. 2.

Referring to FIGS. 2 and 3, a housing body 102 includes a base 110 and at least one clasping member 120 connected to one side of the base 110. The base 110 is disposed inside the housing body 102, and a first plate 130 is protrudingly disposed on the base 110. According to the present embodiment, there are preferably two clasping members 120, respectively disposed at two sides of the base 110. Furthermore, the base 110 of the present embodiment further includes at least one power-and-signal socket 140 and a third plate 150. The aforesaid power-and-signal socket 140 is preferably a three-pin socket, but not limited thereto. A top end of the third plate 150 contacts against an inner surface of the housing body 102, and a height of the third plate 150 is preferably greater than a height of the first plate 130. However, in different embodiments, the height of the third plate 150 can be equal to the height of the first plate 130.

According to the embodiment shown in FIG. 3, the housing body 102 further includes an inner recess 104 contacting against the third plate 150 of the base 110, and thereby moisture is not easy to get into the inside of the housing body 102.

Figure 4:
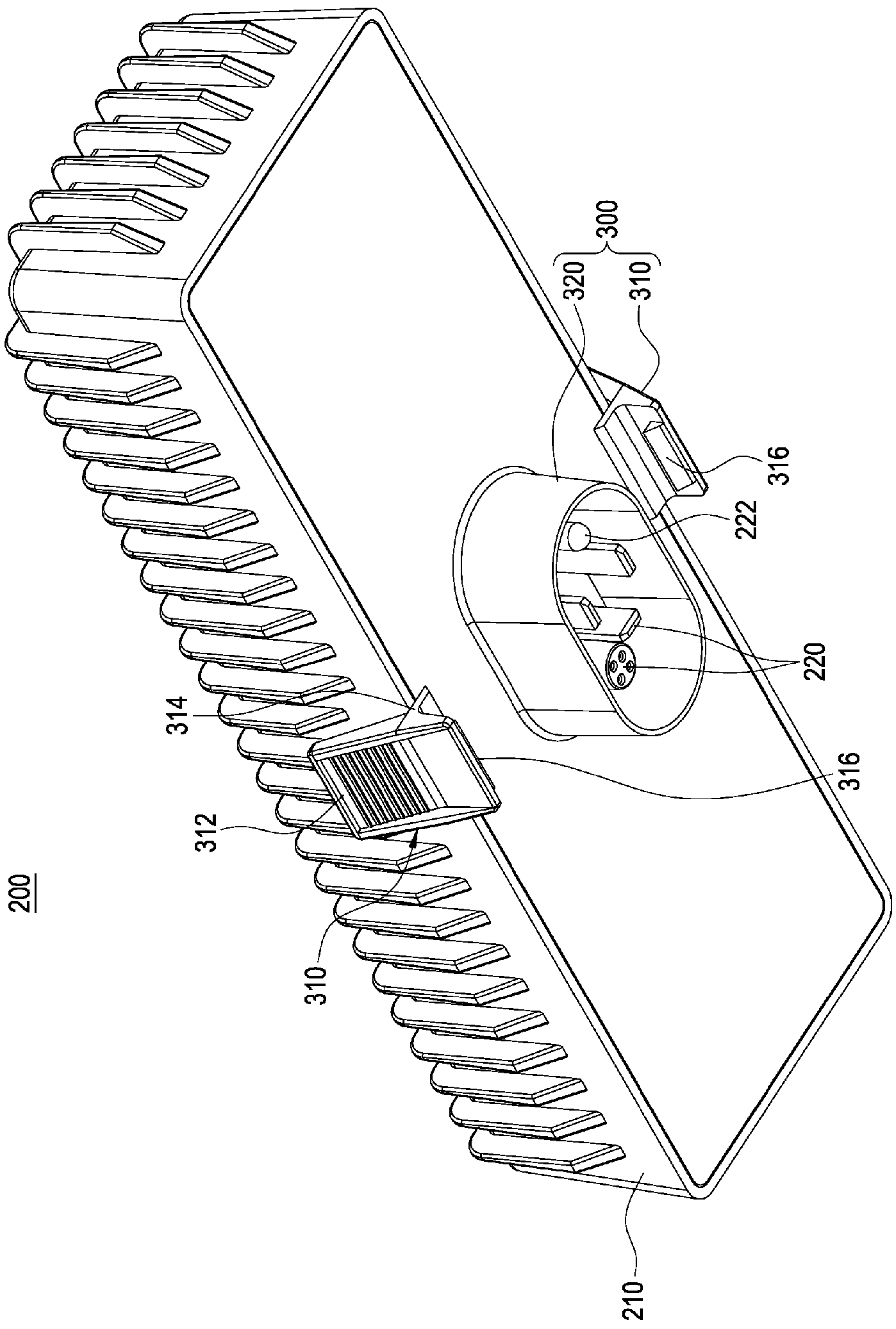
FIG. 4 is a perspective view of an electronic module according to the present invention.
Figure 5:
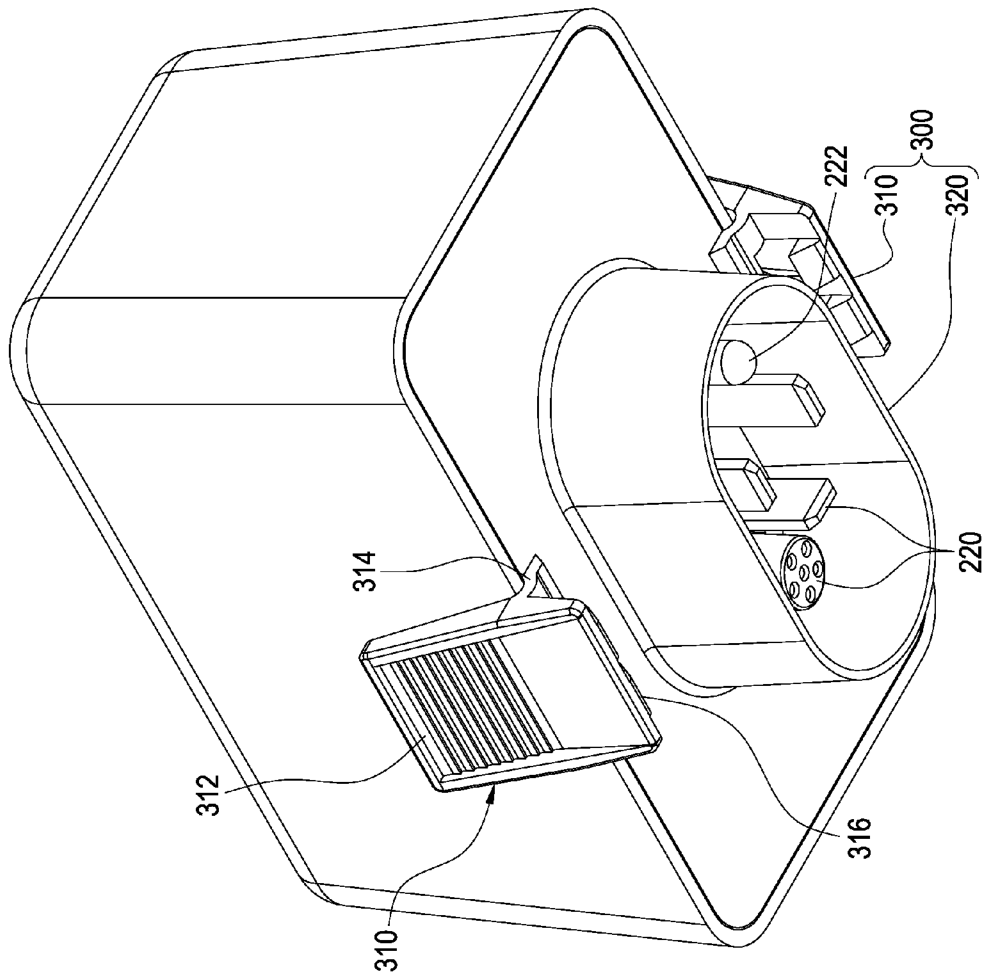
FIG. 5 is another perspective view of the electronic module according to the present invention.

Referring to FIGS. 4 and 5, electronic modules 200, 200' are disposed on the base 110 and corresponding to the clasping member 120. The electronic modules 200, 200' comprise at least one power-and-signal plug 220, a casing 210 and a fastening implement 300 connected to the casing 210. The power-and-signal plug 220 includes ground terminals 222, a circuit board (not illustrated), and etc. The ground terminals 222 are provided for connection with a ground slot 142 of the power-and-signal socket 140, so as to prevent from getting an electric shock or to achieve other effects. It should be noted that, the power-and-signal socket 140 and the power-and-signal plug 220 have various appearances, levels, sizes, and kinds in different countries, and a repetitive description thereof is omitted herein.

The fastening implement 300 includes at least one elastic locking element 310 and a second plate 320. The elastic locking element 310 is provided for engaging the clasping member 120. According to the present embodiment, the elastic locking element 310 further comprises a press portion 312, a pivoting portion 314, and a hook portion 316. The press portion 312 and the hook portion 316 are disposed on two ends of the pivoting portion 314, respectively. The pivoting portion 314 and the fastening implement 300 can either be integrally formed or be assembled and fixed together by screws (not illustrated) and etc. However, in a different preferable embodiment, the elastic locking element 310 can be integrally formed with or respectively assembled to the casing 210 of the electronic modules 200, 200'. An end of the press portion 312 is disposed away from the casing 210. The hook portion 316 is disposed corresponding to the clasping portion 120 and provided for engaging the same.

Referring to FIGS. 4 and 5, a length from the press portion 312 to the pivoting portion 314 is greater than a length from the hook portion 316 to the pivoting portion 314. Therefore, when pressing the press portion 312, the press portion 312 rotates around the pivoting portion 314, and thus the hook portion 316 is easily moved toward a direction away from the second plate 320. Consequently, the hook portion 316 is detached from the clasping member 120, so as to make the electronic modules 200, 200' disassembled from the base 110. Similarly, when assembling the electronic modules 200, 200' on the base 110, the operation is alike.

It should be noted that, the elastic locking element 310, the second plate 320 and the fastening implement 300 are preferably integrally formed and consist of a material including plastic but not limited thereto. However, in another preferable embodiment, the second plate 320 can be integrally formed with the casing 210 of the electronic modules 200, 200'. Furthermore, the fastening implement 300 is preferably fixed to a bottom of the casing 210 of the electronic module 200, 200' by a screw (not illustrated) or other components.

Figure 6:
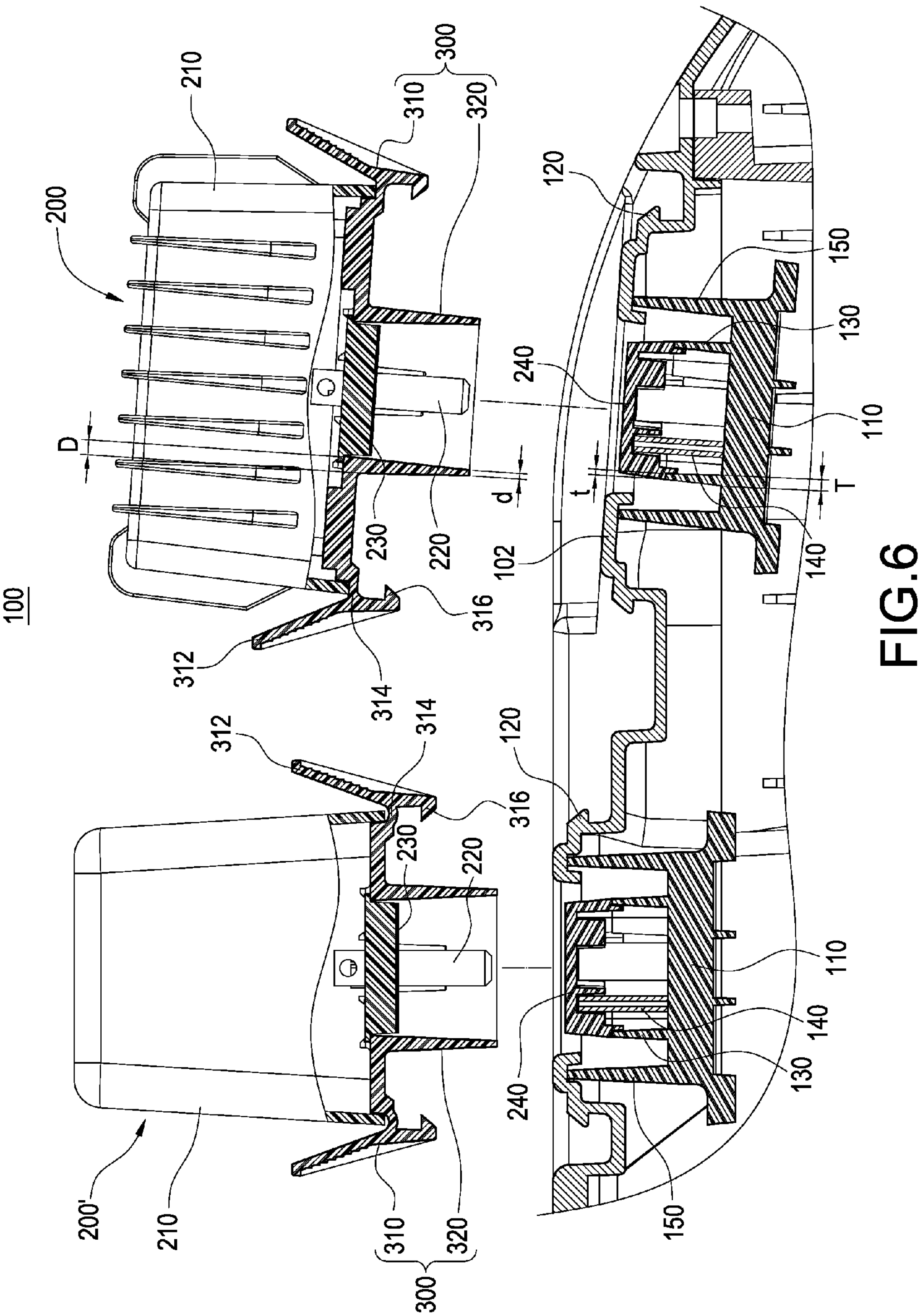
FIG. 6 is a cross-sectional view illustrating a state that the electronic module is not yet assembled to a base according to the present invention.
Figure 7:
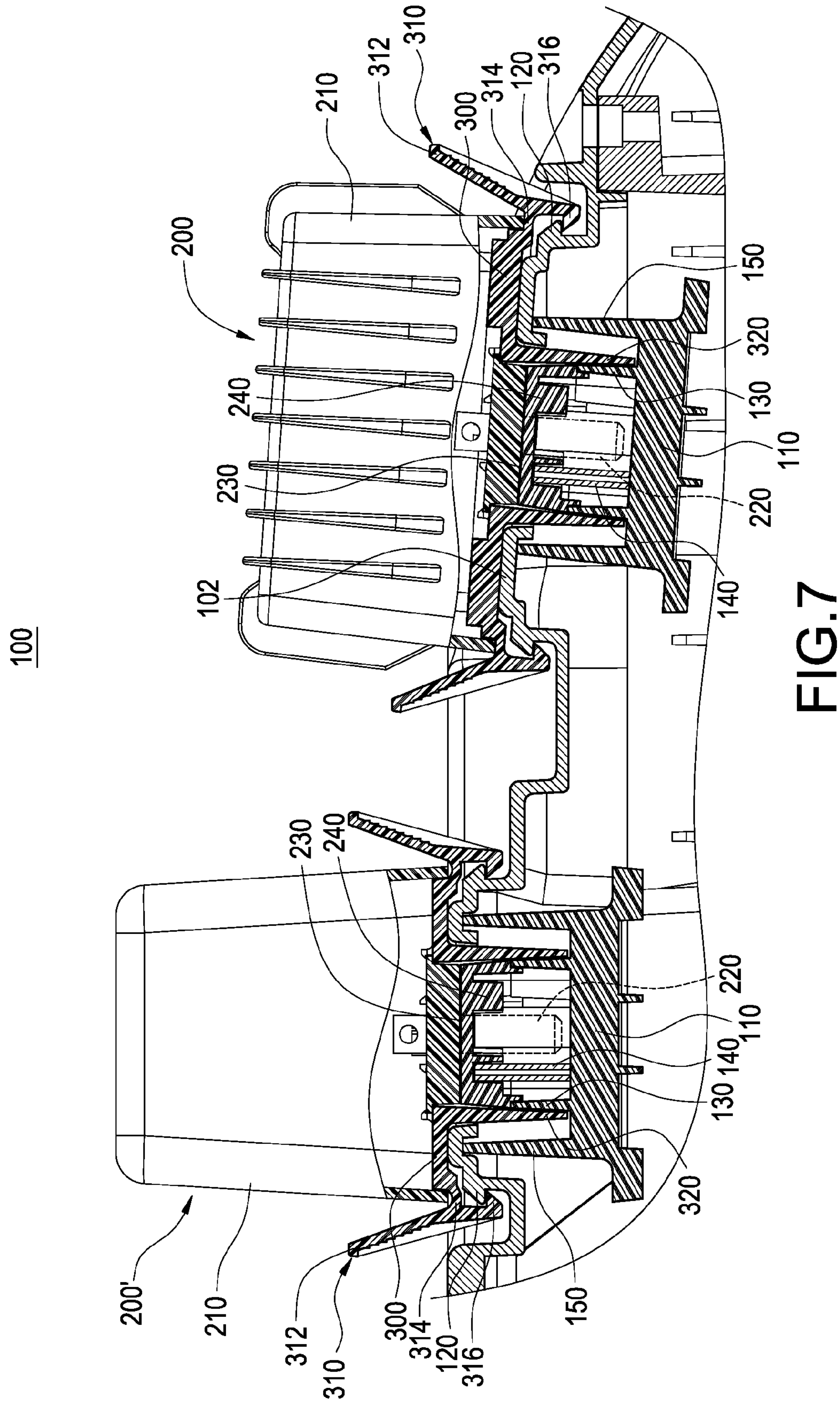
FIG. 7 is a cross-sectional view illustrating a state that the electronic module is assembled to the base according to the present invention.

Referring to FIG. 6 and FIG. 7, the second plate 320 preferably protrudes toward the first plate 130 and contacts against the first plate 130. In the present embodiment, the first plate 130, the second plate 320, and the third plate 150 are preferably an elliptical ring shape in appearance. However, in different embodiments, the first plate 130, the second plate 320, and the third plate 150 may be in a circular shape, a triangular shape, a trapezoidal shape, a polygonal shape, or any other suitable shape.

It should be noted that, a wall thickness T of the first plate 130 connected to a surface of the base is thicker than a wall thickness t of the first plate 130 away from the surface of the base. A wall thickness D of the second plate 320 connected to a surface of the fastening implement 300 is thicker than a thickness d of the second plate away from the surface of the fastening implement 300. Therefore, when assembling the second plate 320 toward the first plate 130, assembling is easily done for the reason that the thinner wall thicknesses t and d of the first and second plates 320 produce a guiding effect therebetween. Furthermore, in a process of assembling the second plate 320 and the first plate 130, the thicker the wall thicknesses T and D of the first and second plates 130 and 320 are, the more compact the assembly of the first and second plates 130 and 320 is. As shown in FIG. 7, preferably, the first plate 130 is contained within a space confined by the second plate 320 and makes in contact against the same, and thereby moisture is not easy to get into the electronic modules 200, 200'.

A lateral side of the hook portion 316 of the elastic locking element 310 has a chamfer angle (not labelled in the drawings), and a lateral side of the clasping member 120 corresponding to the above-mentioned chamfer angle also has a chamfer angle (not labelled in the drawings). Therefore, it only requires an external force to engage the hook portion 316 with the clasping member 120. More specifically, to assemble the electronic modules 200, 200' to the base 110, a repairman or a user only needs to assemble the second plate 320 of the fastening implement 300 to the first plate 130 of the base 110, and then the elastic locking element 310 can engage the clasping member 120 to achieve the assembly. To disassemble/replace the electronic modules 200, 200', it only requires pressing the elastic locking element 310 of the fastening implement 300 to detach the hook portion 316 from the clasping member 120, so as to disassemble the electronic modules 200, 200' from the base 110.

Since a structure of the elastic locking element 310 itself has certain elasticity, assembling or replacing can be done without assistance of any other components/tools. Moreover, the simple structure and convenient operation can effectively reduce a repair/maintenance time and a repair/maintenance cost. The standardized fastening implement 300 is suitable for use on products of any electronic module. Therefore, it is unnecessary to worry about problems such as the products may be pulled off production line, or manufacturing is not easy.

In order to prevent moisture from getting into the structure of the present invention, there are many waterproof designs such as the close contact between the housing body 102 and the third plate 150, the close contact and engagement between the first plate 130 and the second plate 320, and a rubber piece 230, 240 disposed between the power-and-signal plug 220 and the power-and-signal socket 140. As shown in FIGS. 6 and 7, the rubber piece 230, 240 can prevent water from entering into the power-and-signal plug 220 and the power-and-signal socket 140, prevent the moisture from entering into the electronic modules 200, 200' along an inner surface of the second plate 320, and protect the power-and-signal plug 220 from deformation or damage by an external force, thereby prolonging life spans of the power-and-signal socket 140, the power-and-signal socket 220, and other electronic components.

In summary, the electronic device replacement structure of the present invention certainly can achieve the anticipated objects and improve the defects of conventional techniques, and has novelty and non-obviousness, so the present invention completely meet the requirements of patentability. Therefore, a request to patent the present invention is filed according to patent laws. Examination is kindly requested, and allowance of the present application is solicited to protect the rights of the inventor.

What is claimed is:

1. An electronic device replacement structure comprising:

a housing body (102) including a base (110) and at least one clasping member (120) connected to one side of the base (110), the base (110) being disposed inside the housing body (102), a first plate (130) being protrudingly disposed on the base (110); and an electronic module (200, 200') disposed on the base (110) and corresponding to the clasping member (120), the electronic module (200, 200') including a casing (210) and a fastening implement (300) connected to the casing (210), the fastening implement (300) having at least one elastic locking element (310) and a second plate (320), the elastic locking element (310) being provided for engaging the clasping member (120), the second plate (320) protruding toward the first plate (130) and contacting against the first plate (130), wherein the base (110) further comprises a third plate (150), a top end of the third plate (150) contacts against an inner surface of the housing body (102), and a height of the third plate (150) is greater or equal to a height of the first plate (130).

2. The electronic device replacement structure of claim 1, wherein the housing body (102) further includes an inner recess (104) contacting against the third plate (150) of the base (110).

3. The electronic device replacement structure of claim 1, wherein the third plate (150) is in a ring shape in appearance.

4. The electronic device replacement structure of claim 1, wherein at least one elastic locking element (310) further comprises a press portion (312), a pivoting portion (314), and a hook portion (316), the press portion (312) and the hook portion (316) are disposed on two ends of the pivoting portion (314) respectively, an end of the press portion (312) is disposed away from the casing (210), and the hook portion (316) is engaged with the clasping member (120).

5. The electronic device replacement structure of claim 4, wherein a length from the press portion (312) to the pivoting portion (314) is greater than a length from the hook portion (316) to the pivoting portion (314).

6. The electronic device replacement structure of claim 1, wherein the elastic locking element (310), the second plate (320), and the fastening implement (300) are integrally formed.

7. The electronic device replacement structure of claim 1, wherein the first plate (130) and the second plate (320) are in a ring shape in appearance.

8. The electronic device replacement structure of claim 1, wherein the appearance of the first plate (130) and the second plate (320) includes a circular shape, a triangular shape, a trapezoidal shape, or a polygonal shape.

9. The electronic device replacement structure of claim 1, wherein the first plate (130) is further contained inside a space confined by the second plate (320).

10. The electronic device replacement structure of claim 1, wherein a wall thickness (T) of the first plate (130) connected to a surface of the base is thicker than a wall thickness (t) of the first plate (130) away from the surface of the base.

11. The electronic device replacement structure of claim 1, wherein a wall thickness (D) of the second plate (320) connected to a surface of the fastening implement (300) is thicker than a wall thickness (d) of the second plate (320) away from the surface of the fastening implement (300).

12. The electronic device replacement structure of claim 1, wherein the electronic module (200, 200') further comprises a wireless sensor device including at least one power-and-signal plug (220), and the base (110) comprises at least one power-and-signal socket (140) for insertion of the at least one power-and-signal plug (220) thereinto in order to make an electrical connection.

13. An electronic device replacement structure comprising:

a housing body (102) including a base (110) and at least one clasping member (120) connected to one side of the base (110), the base (110) being disposed inside the housing body (102), a first plate (130) being protrudingly disposed on the base (110); and an electronic module (200, 200') disposed on the base (110) and corresponding to the clasping member (120), the electronic module (200, 200') including a casing (210) and a fastening implement (300) connected to the casing (210), the fastening implement (300) having at least one elastic locking element (310) and a second plate (320), the elastic locking element (310) being provided for engaging the clasping member (120), the second plate (320) protruding toward the first plate (130) and contacting against the first plate (130), wherein the electronic module (200, 200') further comprises a power supply device including at least one power-and-signal plug (220), and the base (110) comprises at least one power-and-signal socket (140) for insertion of the at least one power-and-signal plug (220) thereinto in order to make an electrical connection;

wherein a rubber piece (230, 240) is disposed between the power-and-signal plug (220) and the power-and-signal socket (140).

* * * * *